United States Patent [19]

Tanaka et al.

[11] Patent Number: 5,223,305
[45] Date of Patent: Jun. 29, 1993

[54] APPARATUS FOR VAPOR DEPOSITION

[75] Inventors: Koichi Tanaka, Nara; Kousuke Terada, Tenri; Katsushi Okibayashi, Sakurai; Akiyoshi Mikami, Yamatotakada; Masaru Yoshida; Shigeo Nakajima, both of Nara, all of Japan

[73] Assignee: Sharp Kabushiki Kaisha, Osaka, Japan

[21] Appl. No.: 698,797

[22] Filed: May 13, 1991

[30] Foreign Application Priority Data

May 14, 1990 [JP] Japan .................. 2-123570

[51] Int. Cl.⁵ ........................... C23C 16/00
[52] U.S. Cl. ................. 427/255.7; 118/724; 118/725
[58] Field of Search ........ 427/255.7; 118/724, 118/725

[56] References Cited

U.S. PATENT DOCUMENTS 5,074,954 12/1991 Nishizawa ............... 118/725
5,140,939 8/1992 Valentian ............... 118/725

FOREIGN PATENT DOCUMENTS 60-47717 10/1985 Japan .
61-296680 12/1986 Japan .

Primary Examiner—Richard Bueker

[57] ABSTRACT

An apparatus for vapor deposition including a vapor deposition section to which at least one semiconductor material supply passage and at least one alkoxide material supply passage are connected, first heating means provided for the vapor deposition section and capable of maintaining the temperature thereof higher than that of the alkoxide supply passage, second heating means provided for the semiconductor material supply passage and capable of maintaining the temperature thereof higher than that of the vapor deposition section, and third heating means provided for the alkoxide material supply passage and capable of maintaining the temperature thereof constant, and a process for continuously forming a multilayered film on a substrate.

5 Claims, 3 Drawing Sheets

FIG.4 (a) PRIOR ART
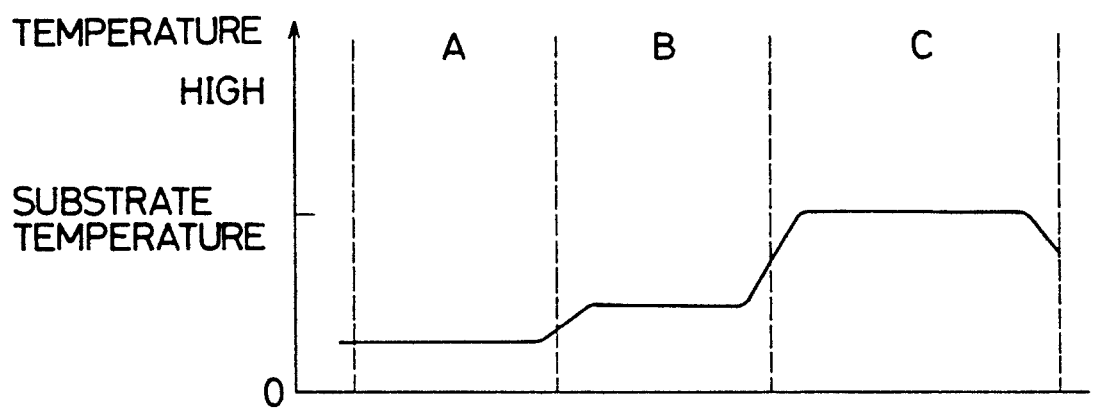
FIG.4 (b) PRIOR ART
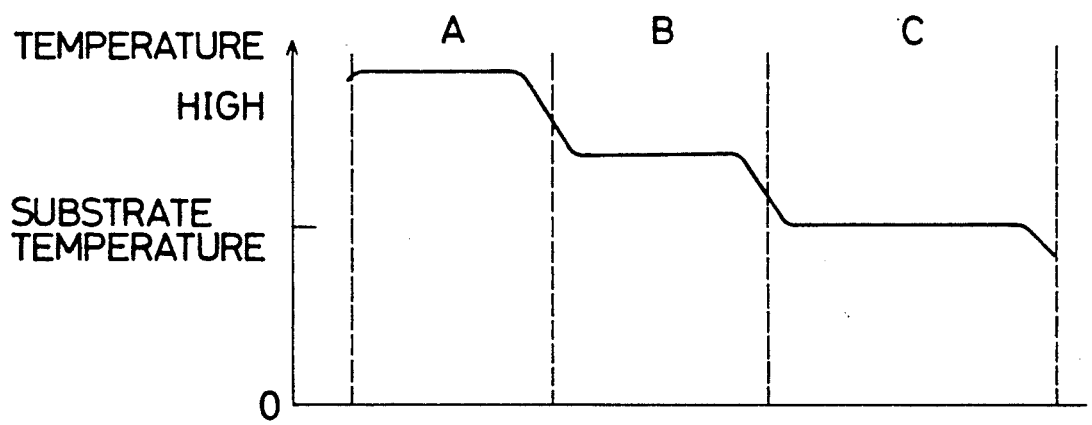

APPARATUS FOR VAPOR DEPOSITION

BACKGROUND OF THE INVENTION

1. Field of the Invention

The present invention relates to an apparatus for vapor deposition and, more specifically to an apparatus for vapor deposition capable of forming a semiconductor layer and an insulating layer in a continuous manner with good productivity, which can be applied, for example, to a fabrication of EL devices.

2. Prior Arts

Thin film EL devices has been put into practical use with a so-called double insulating-layer construction such that a three-layer structure (insulating layer-EL layer-insulating layer) is sandwiched by a pair of electrodes at least one of which is transparent, because such a construction assures good stability and high reliability. In fabricating thin film EL devices of such a construction, it has been a conventional practice that a ZnS:Mn film is formed as an EL layer using an electron-beam evaporation technique while an $Si_3N_4$ film or a like film is formed as an insulating layer using a reactive sputtering. In recent years studies are being conducted on a method for forming an EL layer using a Chemical Vapor Deposition technique (hereinafter abbreviated as "CVD") which can fabricate excellent EL devices (for example, Japanese Published Patent Application No. 47717/1985 and Japanese Unexamined Patent Application No. 296680/1986) and on a method for forming an insulating layer by CVD using an alkoxide (for example, Japanese Unexamined Patent Application No. 296680/1986 and J. A. Aborf: J. Electrochem. Soc. 114. 948, 1967).

In the case of fabricating thin film EL devices using any of the above methods, however, an insulating layer is first formed on a substrate with a first insulating layer-forming apparatus, then the substrate with the insulating layer is transferred to an EL layer-forming apparatus to form an EL layer, and thereafter the substrate with the insulating and EL layers is transferred back to the insulating layer-forming apparatus to form the second insulating layer.

Conventionally, as mentioned above, thin film EL devices have been fabricated by separately forming an insulating layer and an EL layer by means of different apparatuses, thus involving transfer of a substrate. This has resulted in a problem of low productivity in mass production of the EL devices.

Thus, the inventors of the invention have been trying to overcome the abovementioned problem and to provide an apparatus capable of continuously forming a semiconductor layer and an insulating layer in a shortened time and applicable to form the three-layer structure (insulating layer-EL layer-insulating layer) for EL devices.

As a result, the inventors of the present invention have formerly devised a CVD apparatus as shown in FIG. 3 and have examined the fabrication of thin film EL devices by the use of this apparatus (Japanese Unexamined Patent Application No. 289091/1989). The apparatus is so constructed that source materials are supplied from one end of a reactor 4 while exhausted from the other end thereof. Independent three heaters 7, 8a and 8b are provided around the reactor 4 for partly heating the reactor 4. The three heaters divide the inside area of the reactor 4 into three temperature regions, i.e., source material region A, temperature preadjusting region B and substrate temperature region C. A bubbling system 1 causes an alkoxide to be held by a carrier gas by bubbling, the carrier gas holding the alkoxide being introduced into the temperature preadjusting region B of the reactor 4 by means of a conduit tube 6. The alkoxide thus introduced is pyrolyzed and then deposited on a substrate 5 disposed in the substrate temperature region C to form an insulating layer. For forming an EL layer, a parent material and a luminescent center material are respectively placed within source supply tubes 2 and 3 disposed in the source material region A, and are led into the reactor 4 by means of a carrier gas. Thus, the EL layer is formed on the substrate 5. Thanks to the apparatus, the three-layer structure (insulating layer-EL layer-insulating layer) can be continuously formed in the single apparatus without transferring the substrate to another apparatus.

The above apparatus requires, however, a relatively long transition time for shifting from one layer to another. Referring to FIG. 4 which is a schematic temperature profile of the apparatus of FIG. 3. Although the substrate temperature is set to 400°–600° C. for forming any of the three layers, the source material region A and the temperature preadjusting region B are respectively maintained to 100°–150° C. and 200°–250° C. (see FIG. 4a) for forming the insulating layer because the alkoxide material starts pyrolyzing above about 300° C. while set to 800°–1000° C. and 600°–700° C. (see FIG. 4b) respectively for forming the EL layer because a high temperature (800°–1000° C.) is required for sublimation of the parent material and for reaction of the luminescent center material with the carrier gas. Hence, respective temperatures of the source material region A and the temperature preadjusting region B need to be raised for forming the EL layer after the formation of the insulating layer while cooled for forming the other insulating layer after the formation of the EL layer. Consequently, it takes a relatively long time for forming the three-layer structure.

SUMMARY OF THE INVENTION

The present invention is accomplished in view of the above circumstances, and an object thereof is to provide an apparatus for vapor deposition capable of continuously forming the three-layer structure in a considerably shortened time as compared with the formerly devised apparatus.

Thus, the present invention provides an apparatus for vapor deposition comprising a vapor deposition section to which at least one semiconductor material supply passage and at least one alkoxide material supply passage are connected, first heating means provided for the vapor deposition section and capable of maintaining the temperature thereof higher than that of the alkoxide supply passage, second heating means provided for the semiconductor material supply passage and capable of maintaining the temperature thereof higher than that of the vapor deposition section, and third heating means provided for the alkoxide material supply passage and capable of maintaining the temperature thereof constant.

With the apparatus for vapor deposition according to the invention, a semiconductor layer and an insulating layer can be continuously formed in a considerably shortened time without necessity of transferring a substrate, so that the productivity of thin film EL panels is remarkably improved. Hence, it becomes possible to fabricate thin film EL devices of high display quality at a low cost.

BRIEF DESCRIPTION OF THE DRAWINGS

FIG. 1 is a schematic view illustrating an embodiment according to the invention, in which FIG. 1(a) is a schematic illustration of an embodiment apparatus for vapor deposition and FIG. 1(b) is a temperature profile of the inside of the apparatus;

FIG. 4 is a temperature profile of the inside of the apparatus of FIG. 3, in which FIG. 4(a) is a temperature profile for forming an insulating layer and FIG. 4(b) is that for forming an EL layer.

DETAILED DESCRIPTION OF THE PREFERRED EMBODIMENTS

With the apparatus of the invention, a substrate is placed in the vapor deposition section, while a solid semiconductor material is placed in the semiconductor material supply passage. The vapor deposition section is then heated by the first heating means so that the substrate may be heated to a predetermined temperature. At the same time, the semiconductor material supply passage and the alkoxide material supply passage are heated to respectively predetermined temperatures by the second and third heating means. In this case the temperature of a semiconductor material supply furnace is necessarily the highest in the semiconductor material supply passage and which is higher than the predetermined substrate temperature. On the other hand, the temperature of an alkoxide supply furnace is necessarily maintained constant and which is lower than the predetermined substrate temperature. The first, second and third heating means are independently controlled by the control means (e.g., a microprocessor) to maintain the respectively predetermined temperatures.

When a semiconductor layer is to be formed, a carrier gas is introduced into the semiconductor material supply passage from the outside of the apparatus and which holds vapor of the semiconductor material and leads it onto the substrate, so that the semiconductor layer is formed. On the other hand, when an insulating layer is to be formed, vapor of the alkoxide material is held by a carrier gas with an external device of the present apparatus and which is led onto the substrate through the alkoxide material supply passage, so that the insulating layer is formed.

Hereinafter, a preferred embodiment is described in more detail with reference to the drawings.

Figure 1:
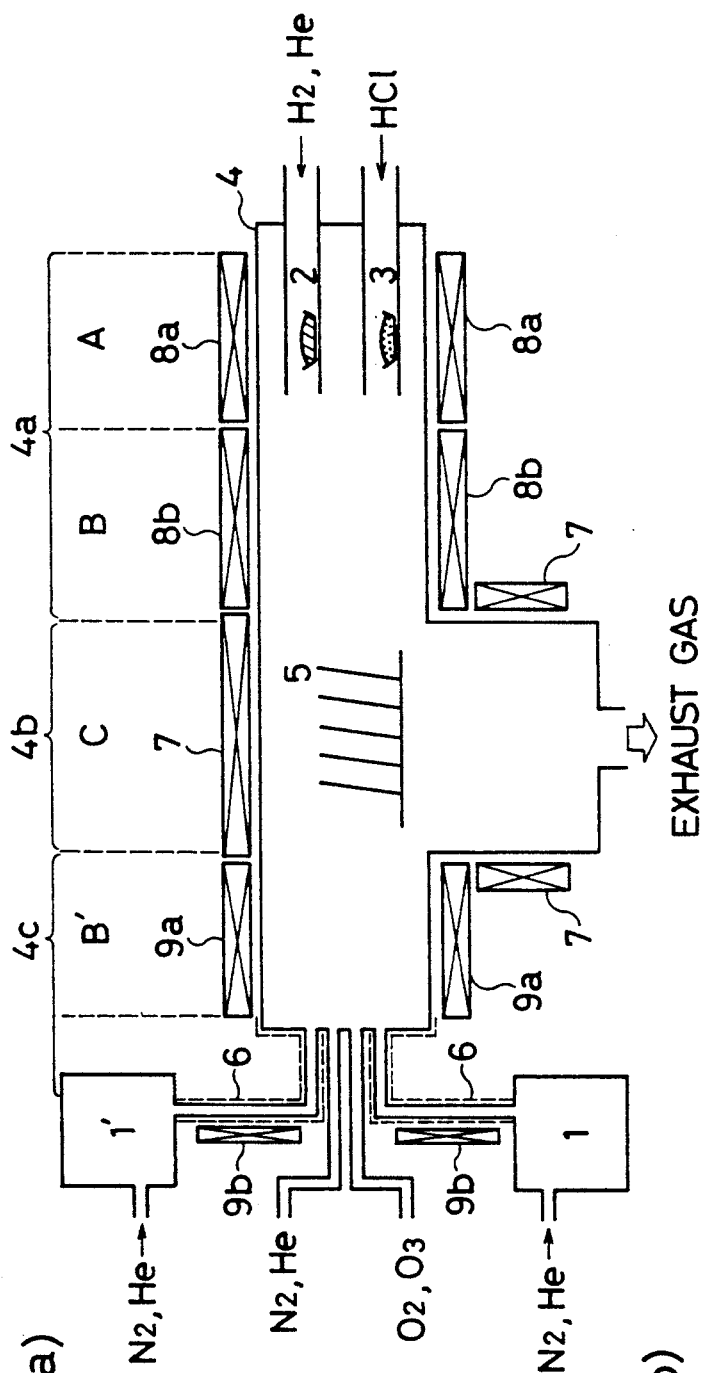
Figure 1:
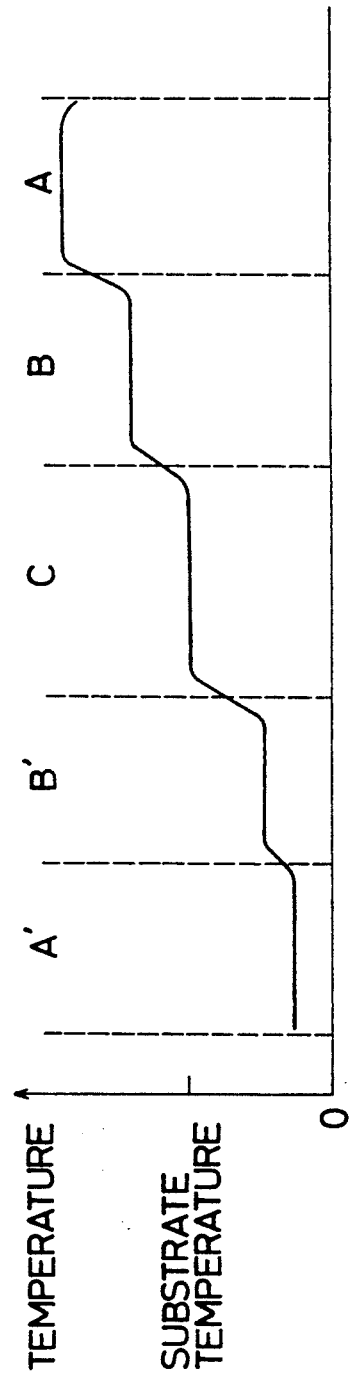

Referring to FIG. 1, the embodiment apparatus is so constructed that a vapor deposition section 4b in which a substrate 5 is to be placed is connected with a semiconductor material supply passage 4a and with an alkoxide material supply passage 4c. Provided with a heater 7 is the vapor deposition section 4b, with heaters 8a and 8b is the semiconductor material supply passage 4a, and with heaters 9a and 9b is the alkoxide material supply passage 4c. Since an EL layer is formed as a semiconductor layer in the present embodiment, a source material region A of the semiconductor material supply passage 4a is provided with a parent material supply tube 2 and a luminescent center material supply tube 3, the temperature of the source material region A being controlled by the heater 8a. The heater 8b controls the temperature of a temperature preadjusting region B. The alkoxide material supply passage 4c is provided with introduction tubes 6,6 which are respectively connected to bubbling systems 1 and 1'. The heater 9a heats a part of the alkoxide material supply passage 4c which is hence defined as a temperature preadjusting region B', while the heater 9b heats the introduction tubes 6,6 which are hence defined as a preheating region A'. In the present apparatus the heater 7, the heaters 8a and 8b, and the heaters 9a and 9b constitute the first, second and third heating means, respectively. It should be noted that the bubbling systems 1 and 1' also have respective heating means.

Figure 2:
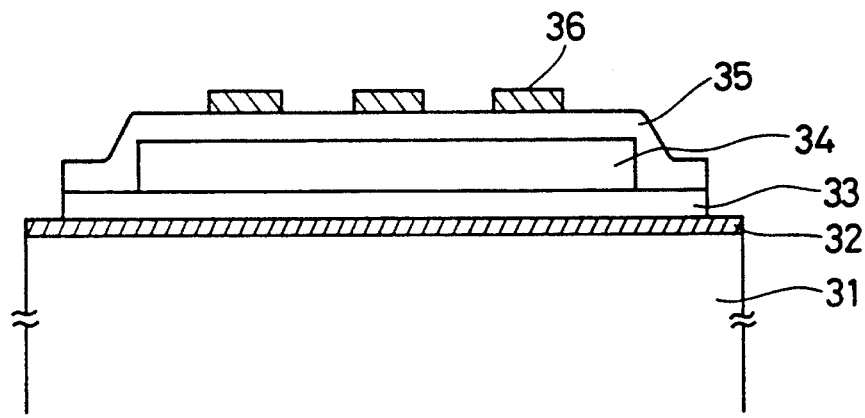
FIG. 2 is a sectional view illustrating a structure of an EL device fabricated in the embodiment.

To be described next is the case of fabricating an EL device shown in FIG. 2 by the use of the present apparatus.

A transparent substrate 31 made of glass and the like is formed with an ITO film 32 of about 3000 A thick which is subsequently etched to form a striped pattern, so that the substrate 5 is formed. The substrate 5 is placed within the present apparatus, then the apparatus is heated so as to have a predetermined temperature profile as shown in FIG. 1(b). Thereafter, $Al(OC_3H_7)_3$ and $Ta(OC_2H_5)_5$ as the alkoxide materials are respectively put into the bubbling systems 1 and 1' in which an inert gas such as $N_2$ and He is used as a bubbling gas. The alkoxide materials thus bubbled are introduced into a reactor 4 and led onto the substrate 5 maintained at about 450° C. thereby forming an insulating layer thereon to about 3000 A thick through pyrolysis. $Al(OC_3H_7)_3$ and $Ta(OC_2H_5)_5$ are maintained at about 120° C. and about 140° C. in the respective bubbling systems. The introduction tubes 6,6 are heated to about 180° C. for preventing the vaporized alkoxide materials from condensing (liquefying). Since the deposition rate of the insulating layer depends greatly on the supply rate of the source material and the substrate temperature, the deposition rate can be controlled by adjusting the supply rate of the source material on the basis of the temperature of the bubbling systems and the flow rate of the bubbling gas. The substrate temperature is usually set to 300°-600° C. in the present invention. In this embodiment, since the substrate temperature is specifically set to about 450° C., setting the flow rate of the $N_2$ bubbling gas to 25-100 SCCM can obtain the deposition rates of 200 A/min and 100 A/min for an $Al_2O_3$ film and $Ta_2O_5$ film, respectively. Under such conditions, varying the deposition time makes it possible to easily obtain a laminated film of $Al_2O_3$ and $Ta_2O_5$ layers each having a desired thickness or a film of $TaAlO_x$ of a desired thickness as a mixed film of the aforesaid layers. It is noted that if $O_2$ or $O_3$ gas is introduced with the bubbling gas, the pyrolyzing temperature can be controlled. Incidentally, the temperature preadjusting region B' is maintained at 200°-250° C. as in the formerly devised apparatus.

As soon as the insulating layer is formed, supply of the source material thereof is stopped, then the temperature of a substrate temperature region C is raised so that the substrate temperature may reach about 500° C. This takes about 10 minutes.

Thereafter, ZnS as a parent material for an EL layer 34 along with Mn as a luminescent center material is supplied to form a ZnS:Mn film of about 6000 A thick as the EL layer 34. In this case the deposition rate of the ZnS:Mn film is about 100 A/min. The parent material ZnS is heated up to about 900°-1000° C. to evaporate, then the vapor is supplied by means of an $H_2$ carrier gas.

He or a like gas may be used as the carrier gas instead of H₂. The luminescent center material Mn is heated up to about 800°-900° C. and which is subjected to a flow of an HCl gas thereby causing the following reaction:

Mn (solid)+2HCl (gas) MnCl₂ (gas)+H₂ (gas)

and the resulting gas is introduced into a reactor 4. A source gas of the luminescent center material such as ZnCl₂, H₂ and MnCl₂ may be directly introduced into the reactor 4. For differentiating in temperature between the ZnS material and the Mn material, only to do is make the positions of the materials in the respective material supply tubes 2 and 3 different from each other. The temperature preadjusting region B is maintained at 600°-700° C.

Once the EL layer is formed, the substrate temperature is lowered back to about 450° C., then an insulating layer 35 is formed in the same manner in which the insulating layer 33 is formed.

Thus, the three-layer structure (insulating layer 33-EL layer 34-insulating layer 35) is formed. Thereafter, the substrate is removed from the present apparatus and which is then formed with an Al electrode 36 of striped shape so that it may extend in the direction perpendicular to the stripe direction of the ITO electrode. Thus, a thin film EL device is completed.

With the apparatus of the invention, as described above, the three-layer structure (insulating layer 33-El layer 34-insulating layer 35) can be formed in a continuous manner. In the following Table 1, compared are processes for forming the above three-layer structure respectively using (a) a conventional apparatus, (b) the formerly devised CVD apparatus and (c) the apparatus of the embodiment according to the invention.

TABLE 1

| (a) Conventional Apparatus | (b) Formerly Devised Apparatus | (c) Apparatus of the present embodiment |
|---|---|---|
| 1) placing a substrate | 1) placing a substrate FIG. 4(a) | 1) placing a substrate FIG. 1(b) |
| ↓ | ↓ | ↓ |
| 2) raising the temperature | 2) raising the temperature | 2) raising the temperature |
| ↓ | ↓ | ↓ |
| 3) forming the first insulating layer | 3) forming the first insulating layer | 3) forming the first insulating layer |
| ↓ | ↓ | ↓ |
| 4) lowering the temperature | 4) changing the distribution of temperature in the reactor FIG. 4(b) | 4) changing the substrate temperature |
| ↓ | | |
| 5) placing a substrate | | |
| ↓ | | |
| 6) raising the temperature | | |
| ↓ | ↓ | ↓ |
| 7) forming an EL layer | 5) forming an EL layer | 5) forming an EL layer |
| ↓ | ↓ | ↓ |
| 8) lowering the temperature | 6) changing the distribution of temperature in the reactor FIG. 4(a) | 6) changing the substrate temperature |
| ↓ | | |
| 9) placing a substrate | | |
| ↓ | | |
| 10) raising the temperature | | |
| ↓ | ↓ | ↓ |
| 11) forming the second insulating layer | 7) forming the second insulating layer | 7) forming the second insulating layer |
| ↓ | ↓ | ↓ |
| 12) lowering the temperature | 8) lowering the temperature | 8) lowering the temperature |

Figure 3:
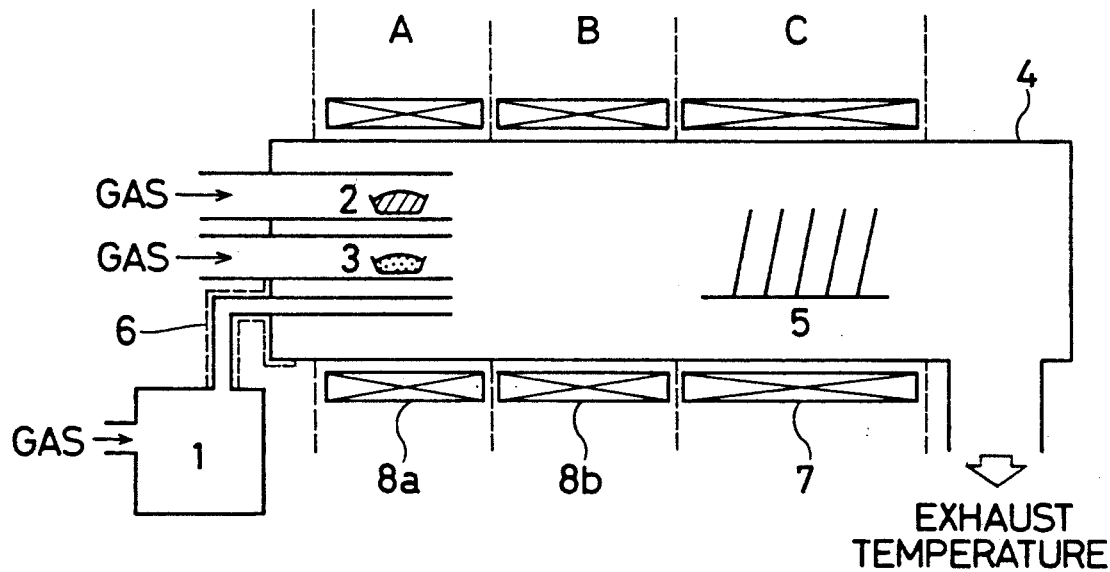
FIG. 3 is a schematic illustration of a CVD apparatus formerly devised by the present inventors.

As can be understood from Table 1, with the apparatus of the present invention, four steps can be omitted as compared with the conventional method in which a plurality of apparatus are used. Further, as compared with the case of using the apparatus of FIG. 3, the apparatus of the present invention enable to considerably shorten the time required for fabricating the three-layer structure, though the number of the fabricating steps is the same. This is because the apparatus of FIG. 3 requires about 150 minutes at each step of step 4 and step 6 since each of the steps involves varying the temperature by about 800° C., while in contrast the apparatus of the present invention requires only about 10 minutes since each of the steps involves the temperature variation by only about 50° C. Furthermore, if the substrate temperature is set to the same for forming the insulating layer and the El layer, the steps 4 and 6 can be further omitted, whereby the three-layer structure can be continuously formed in a further shortened time without entailing a so-called waiting time.

While only a certain presently preferred embodiment has been described in detail, as will be apparent with familiar with the art, certain changes and modifications can be made without departing from the scope of the invention. For instance, the semiconductor material supply passage may be divided, for example, into two supply passages for the parent material and the luminescent center material, respectively; and the alkoxide material supply passage may also be divided into a plurality of passages. Further, the EL layer is not limited to that in the embodiment, it may be of, for example, ZnS:Mn, ZnS:Tb, ZnS:Sm, CaS:Eu, SrS:Ce; and any alkoxide material may be used for the insulating layer, for example, Al(OC₂H₅)₃, Ti(OC₂H₅)₄ and Si(OC₂H₅)₄.

What is claimed is:

1. An apparatus for vapor deposition comprising a vapor deposition section to which at least one semiconductor material supply passage and at least one alkoxide material supply passage are connected, first heating means provided for the vapor deposition section and capable of maintaining the temperature thereof higher than that of the alkoxide supply passage, second heating means provided for the semiconductor material supply passage and capable of maintaining the temperature thereof higher than that of the vapor deposition section, and third heating means provided for the alkoxide material supply passage and capable of maintaining the temperature thereof constant.

2. The apparatus of claim 1, wherein the vapor deposition section is centrally provided in an apparatus body and which is connected with the semiconductor material supply passage at one end while connected with the alkoxide material supply passage at the other end.

3. The apparatus of claim 1, further comprising means for controlling the first, second and third heating means independently.

4. The apparatus of claim 1, wherein the second heating means provided for the semiconductor material supply passage is composed of at least two heaters which are independently controlled by control means to heat a portion adjacent the vapor deposition section and a semiconductor material placed portion, respectively.

5. A process for continuously forming a multilayered film using the apparatus of claim 1 comprising the steps of:

(I) raising the temperature of a substrate placed in the vapor deposition section to a predetermined temperature by actuating the first heating means;

(II) forming a first insulating layer on the substrate by supplying thereto an alkoxide material heated by actuating the third heating means;

(III) forming a semiconductor layer on the first insulating layer by varying the temperature of the substrate with the first heating means as well as by heating the semiconductor material supply passage with the second heating means; and (IV) forming a second insulating layer by further varying the temperature of the substrate with the first heating means and by conducting the step (II).

* * * * *